United States Patent [19]
Reinberg

[11] Patent Number: 6,120,942
[45] Date of Patent: *Sep. 19, 2000

[54] METHOD FOR MAKING A PHOTOMASK WITH MULTIPLE ABSORPTION LEVELS

[75] Inventor: Alan R. Reinberg, Boise, Id.

[73] Assignee: Micron Technology, Inc., Boise, Id.

[ * ] Notice: This patent issued on a continued prosecution application filed under 37 CFR 1.53(d), and is subject to the twenty year patent term provisions of 35 U.S.C. 154(a)(2).

[21] Appl. No.: 08/801,652

[22] Filed: Feb. 18, 1997

[51] Int. Cl.[7] .................................................... G03F 9/00
[52] U.S. Cl. ................................. 430/5; 216/12
[58] Field of Search .................................. 430/5; 216/12

[56] References Cited

U.S. PATENT DOCUMENTS

| | | | |
|---|---|---|---|
| 5,246,799 | 9/1993 | Pierrat | 430/4 |
| 5,465,859 | 11/1995 | Chapple-Sokol et al. | 216/12 |
| 5,536,604 | 7/1996 | Ito | 430/5 |
| 5,667,700 | 9/1997 | Rudigier et al. | 216/12 |
| 5,725,973 | 3/1998 | Han et al. | 430/5 |

OTHER PUBLICATIONS

Csepregi et al., "Fabrication of Silicon Oxynitride Masks for X-Ray Lithography", J. Vac. Sci. Technol. vol. 16 No. 6, Nov./Dec. 1979.

A.K. Pfau et al., "Exploration of Fabrication Techniques for Phase–Shifting Masks," SPIE, vol. 1463, Mar. 6–8, 1991, pp. 124–134. (Abstract also attached).

Burn J. Lin, "The Attenuated Phase–Shifting Mask," Solid State Technology, vol. 35, No. 1, Jan. 1992, pp. 43–47. (Abstract also attached).

Alessandro Callegari et al., "Optical properties of hydrogenated amorphous–carbon film for attenuated phase–shift mask applications," Journal of Vacuum Science & Technology B, Second Series, vol. 11, No. 6, Nov./Dec. 1993, pp. 2697–2699. (Abstract also attached).

*Primary Examiner*—Mark Chapman
*Attorney, Agent, or Firm*—Fletcher, Yoder & Van Someren

[57] ABSTRACT

A photomask for manufacturing a semiconductor device. The photomask is manufactured by a providing a photomask substrate and alternately depositing a plurality of layers of a light-absorbing material and of an etch-stop material on the photomask substrate. The light-absorbing material is selected as having a well-defined etching selectivity from that of the etch-stop material. The layers are successively patterned by removing by a selective etching process at least a portion of at least one of said layers, the portion removed from a lower, in relation to the substrate, layer a subset of the portion removed from a higher layer. Together, the patterned layers are used as a photomask to photolithographically imprint a pattern of a photoresist on a semiconductor wafer under manufacture. The photoresist is used in the etching process of the semiconductor wafer.

45 Claims, 3 Drawing Sheets

METHOD FOR MAKING A PHOTOMASK WITH MULTIPLE ABSORPTION LEVELS

BACKGROUND OF THE INVENTION

1. Field of the Invention

The present invention relates generally to the manufacture and use of a photomask used in photolithographic processes during the manufacture of integrated circuits. More particularly, the present invention is directed to a photomask offering controllable multiple radiation-absorption levels and to a method for manufacturing the photomask.

2. Description of the Related Art

Certain integrated circuit fabrication processes require precise delimitation of areas to be affected by the fabrication process and of areas to be protected from the fabrication process. Photomasks are patterned masks used in photolithographical processes for selectively inhibiting the exposure to radiation, such as light, specific regions of a material to be patterned, while allowing radiation to act on other regions.

Conventional photomasks include a patterned layer of a light-blocking material, usually chromium, used to block transmission of the particular form of light used. Conventional chromium masks generally provide only one level of complete absorption—that is, light is either totally blocked by the chromium or transmitted in those regions from which the chromium has been removed. These "on-off" photomasks are referred to as binary intensity masks (BIM).

The exposure level of the photoresist, which is the material to be patterned using the photomask, can be controlled by raising or lowering the illumination level. This procedure causes all features defined by the photomask to receive approximately the same light exposure. To provide greater versatility in the exposure of photoresist patterns, particularly in the submicron regime, it would be desirable to have some features that receive relatively greater or less exposure than other features. For example, it is generally helpful if larger features receive less exposure than small features. Of course, it is possible to vary the exposure levels by using separate photomasks and repeating the exposure process. However, this repetitive process is impractical, requiring additional masks and additional exposure and development steps.

As an alternative to existing BIM photomasks, photomasks have been prepared which function to phase-shift the light energy. The basic principle of such masks is to use a phase-shifting material to interfere with the electric fields of light passing through adjacent open features and, thus, cause the annihilation of superimposed fields with opposite phases. One type of phase-shifting photomask, an attenuated phase-shifting mask (APSM), uses a film of a slightly transmissive absorber with a 180° phase shift. By controlling the thickness and optical properties of the mask, such as by changing the chemical content of the film, two levels of light-transmission can be achieved in a single mask.

However, phase-shifting systems provide only limited control of absorption levels and require complex manufacturing processes. Additionally, researchers of phase-shifting systems have encountered difficulties applying such systems to arbitrary mask patterns and obtaining accurate feature delineation.

In view of the problems described above, a need remains for a photomask which can be efficiently manufactured and which offers multiple absorption levels. Accordingly, there is provided herein a photomask and method of its use which allows different portions of the photoresist to be exposed simultaneously to various levels of exposure using a single exposure process.

SUMMARY OF THE INVENTION

In accordance with one aspect of the present invention, there is provided a semiconductor manufacturer mask. The mask includes a plurality of radiation-absorbing layers. At least one etch-stop layer is disposed between the radiation absorbing layers.

In accordance with another aspect of the present invention, there is provided a semiconductor manufacturer mask having multiple light-absorption levels. The mask includes a plurality of light-absorbing layers. At least one etch-stop layer is disposed between the light-absorbing layers.

In accordance with yet another aspect of the present invention, there is provided a method for manufacturing a photomask having multiple light-absorbing levels. A photomask substrate is provided. A plurality of alternating layers of a light-absorbing material and of an etch-stop material are formed on the photomask substrate. The light-absorbing material and the etch-stop material are selectively etchable in relation to each other.

In accordance with still another aspect of the present invention, there is provided a method for manufacturing a photomask having multiple light-absorbing levels. A photomask substrate is provided. A first layer of a generally light-absorbing material is deposited onto the substrate. A second layer of a buffer material is formed onto the first layer. The second layer of buffer material is selectively etchable relative to the first layer. A third layer of a generally light-absorbing material is deposited. The third layer is selectively etchable relative to the second layer.

In accordance with a further aspect of the present invention, there is provided a method for patterning a semiconductor device. A photomask substrate is provided. A plurality of alternating layers of a light-absorbing material and of an etch stop material is formed on the photomask substrate. The layers are successfully patterned by removing at least a portion of at least one of the layers by selective etching process to form a photomask. A semiconductor wafer is provided. A photoresist is applied to at least a portion of the surface of the semiconductor wafer. The photomask is aligned over at least a portion of the photoresist. The photomask is exposed to light. The photoresist is developed.

In accordance with a still further aspect of the present invention, there is provided a method for manufacturing a semiconductor device. A photomask is provided. The photomask includes the plurality of selectively patterned light-absorbing layers. A semiconductor wafer under fabrication is provided. The wafer has a layer of photoresist at least partially over the wafer. The semiconductor wafer is exposed to light through the photomask. The photoresist is developed.

In accordance with a yet further aspect of the present invention, there is provided a method for patterning a semiconductor device. A photomask is provided. The photomask includes a substrate element. A first layer of a generally light-absorbing material is supported by the substrate. The first layer is over at least a first portion of the substrate. A buffer layer is over the first layer. A second layer of a generally light-absorbing material is supported over the buffer layer. The second layer is over a second portion of the substrate. The second portion is a substrate of the first portion. A semiconductor wafer under fabrication is provided. The wafer has a layer of photoresist at least partially over the wafer. The semiconductor wafer is exposed to light through the photomask. The photoresist is developed.

BRIEF DESCRIPTION OF THE DRAWINGS

The foregoing and other advantages of the invention will become apparent upon reading the following detailed description and upon reference to the drawings in which.

DETAILED DESCRIPTION OF SPECIFIC EMBODIMENTS

Described below is a photomask having multiple radiation-absorption levels. The photomask may be utilized with optical photolithography systems and provide multiple absorption layers relative to a light-radiation surface. The photomask may be used with other types of radiation, including infrared and ultraviolet, and other radiation masking lithography operations wherein selective control of degree of radiation transmission through a mask is of benefit to the operation. The photomark is a composite multi-layered structure, including a plurality of superimposed light-absorbing material layers and etch-stop material layers. The multi-layered structure is manufactured by alternatively forming the layers over a photomask substrate, each etch-stop material layer placed between two relatively light-absorbing material layers.

Figure 1:
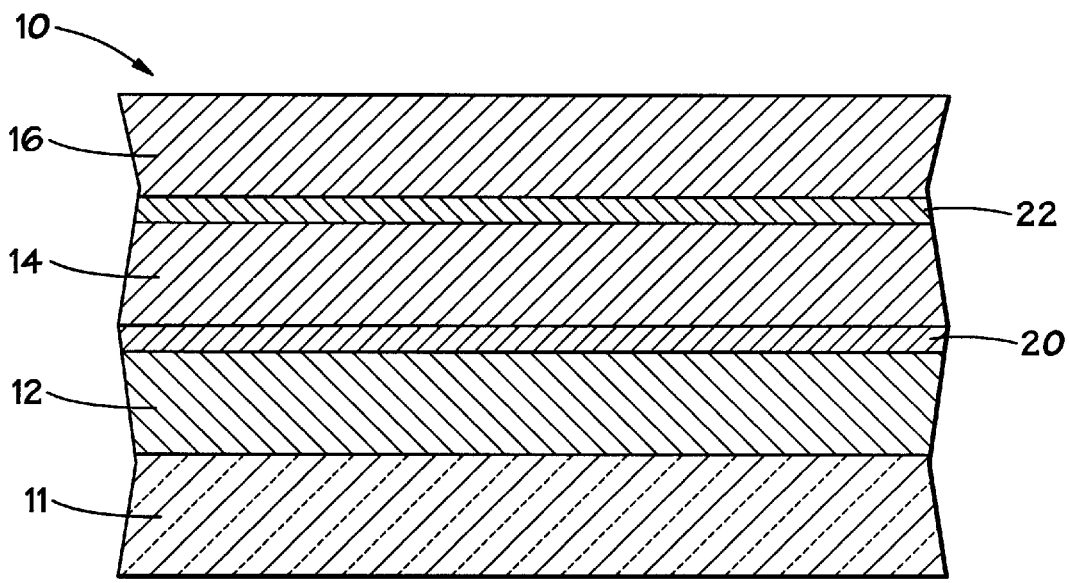
FIG. 1 depicts a portion of a photomask blank manufactured in accordance with the present invention, illustrated in vertical section.

Turning now to the drawings, FIG. 1 illustrates an exemplary embodiment of a photomask blank assembly 10 manufactured in accordance with the present invention. Photomask blank 10 includes three layers, 12, 14, and 16 of a generally light-absorbing material. Placed between the light-absorbing material layers 12, 14, and 16 are relatively thinner layers 20 and 22 of an etch-stop or buffer material. This buffer material is selected depending upon the etch process for the selected light-absorbing material. The term "light" as used herein is meant to include radiation having wavelengths in the visible spectrum, infrared, ultraviolet, deep ultraviolet regions (including G, H, and I-line wavelength radiation), and X-ray regions. Photomasks described herein may be utilized with these and other forms of radiation used in optical photolithography techniques or techniques wherein exposure may be controlled through absorbing or blocking the radiation. "Light-absorbing" as used herein is meant to define a material which, for the resist exposure wavelengths used in the selected photolithography technique, absorbs or reflects at least a portion of the light impinging the surface of the material. The term, thus, expressly includes materials which partially transmit light.

Light-absorbing layers 12, 14, and 16 are supported by an appropriate support surface 11, such as a quartz plate, soda-lime glass, borosilicate glass, or other suitable surface. Other suitable photomask substrate materials known in the art, such as sapphire, may also be used. Support surface 11 may be selected in accordance with properties that have acceptable transmission thermal expansion and optical transmission characteristics for the specific application.

Selection of an appropriate light-absorbing material is generally based on physical characteristics, optical properties, and etching selectivity. A particularly advantageous material may exhibit relatively high coefficients of hardness and toughness to reduce the possibility of scratching or deformation of the photomask. The desired transmission and absorption coefficient of the material may depend, among other factors, upon the range of the desired absorption levels of the finished photomask. Finally, the light-absorbing material may be selected as having a well-defined etching selectivity relative to the etch-stop material for a satisfactory etchant.

While factors such as optical properties, chemical compatibility, and ease of deposition may also affect the selection of the material for the interlaced etch-stop layers, a principal factor is the ability of the material to act as an etching barrier during the etching of the light-absorbing material layers. Likewise, the light-absorbing material can act as an etch barrier during removal or patterning of the etch-stop layers.

An exemplary preferred light-absorbing/etch-stop material pair, used in the embodiment illustrated in FIG. 1, is amorphous silicon and silicon dioxide. Chromium and silicon dioxide could also be utilized as the light absorbing/etch-stop material pair, potentially in combination with one or more layers of amorphous silicon. Other possible light-absorbing materials are titanium, titanium nitride, tungsten and molybdenum. Other suitable material pairs or groupings may also be used.

To manufacture photomask 10, an appropriate photomask support surface 11 is first provided. Support surface 11 is originally prepared by cutting glass or quartz plates from large sheets. In a conventional manner, the plates are cleaned to remove chips and graded for flatness. The plates are further polished, cleaned, and inspected before the application of the first light-absorbing layer 12. Alternate layers of light-absorbing material 12, 14, and 16 and etch-stop material 20 and 22 are then formed over the support surface 11. One method of deposition of an amorphous silicon light-absorbing layer 12, 14, or 16 may be low pressure chemical vapor deposition (LPCVD) conducted at temperatures generally below 580° C. The $SiO_2$ etch-stop layers 20 and 22 may be deposited using low temperature deposition of $SiO_2$, such as in an atmospheric pressure CVD reactor (APCVD) or in a plasma-enhanced CVD reactor (PECVD).

In most processes, it is important that the $SiO_2$ deposition occur generally below approximately 580° C. so as to preserve the amorphous state of the deposited silicon layer (s). Although the thickness of the layers may vary depending on the selected light spectrum and exposure time, the thickness for the amorphous silicon layers 12, 14, and 16 of the present embodiment is 300–800A, and the thickness for the $SiO_2$ layers 20 and 22 of the present embodiment is 100–500A.

Figure 2:
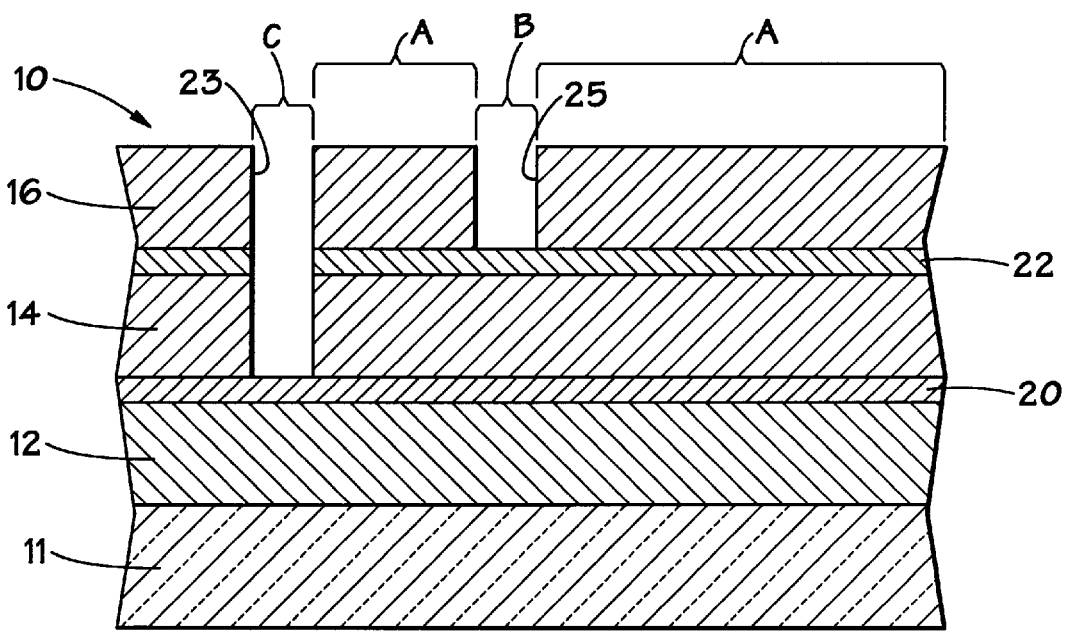
FIG. 2 depicts the photomask blank of FIG. 1 during an intermediate manufacturing step, also illustrated in vertical section.

FIG. 2 illustrates a step in the manufacture of photomask 10 wherein layers 12, 20, and 14 have been formed successively over supporting surface 11 using a deposition process or other suitable method. The number of light-absorbing and etch-stop layers can be readily altered in alternative embodiments. Generally, for every n layers of light-absorbing material, there will be n−1 layers of etch-stop material. The number of layers is determined by the desired number of absorption levels. In general, n layers of silicon with n−1 intervening layers of silicon oxide will provide for at least n+1 possible absorption or exposure levels. More absorption levels are possible (2n), if the intermediate etch-stop layer also comprises a suitable light-absorbing material.

Figure 3:
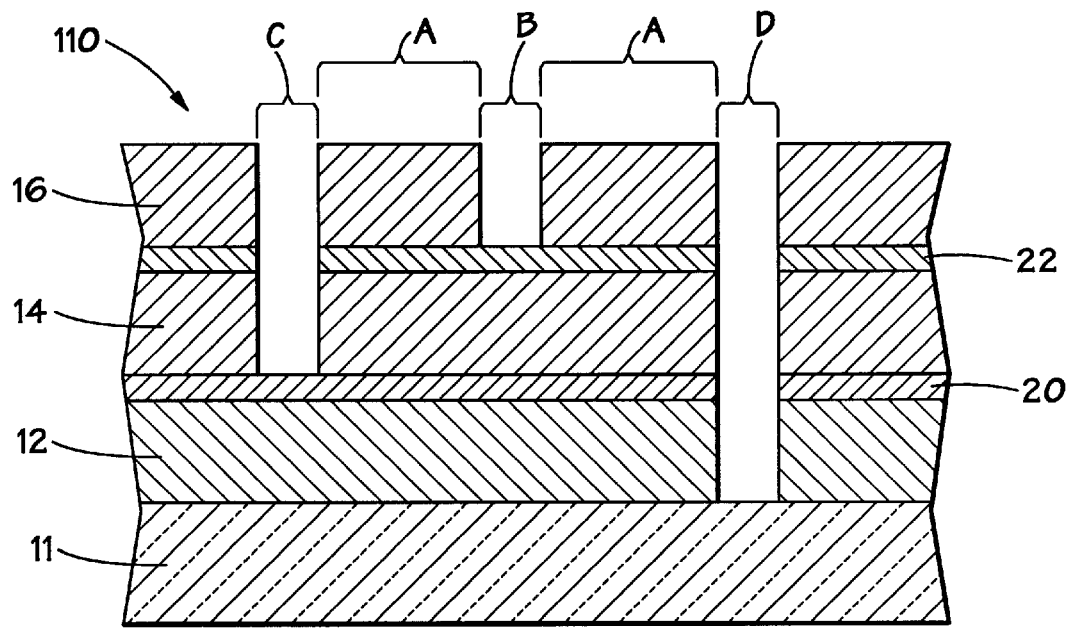
FIG. 3 depicts a photomask manufactured from the photomask blank of FIG. 1 including a multi-tiered photomask pattern, again illustrated in vertical section.

Together the layers 12, 14, 16, 20, and 22 form a composite multi-layered structure. Upon formation of the last layer, the photomask blank 10 can be patterned by removing portions 23 and 25 of one or more layers along selected regions in response, for example, to the size of the features being defined. FIG. 3 illustrates a photomask 110 manufactured from the photomask blank 10 shown in FIG. 1.

In the present embodiment, to pattern photomask blank 10 into photomask 110, portions of one or more layers along selected regions are successively and selectively removed by repeated etching steps. The higher layers, that is, the layers farthest from the support surface 11, can serve, at least partly, as masks for the patterning of the lower layers. Alternatively, the layer immediately below a layer which is being etched, acts as an etching barrier to prevent damage to underlying layers. The photomask 110 can be patterned to have a positive polarity (clear-field) or a negative polarity (dark-field). Dry etching is a preferred removal method, although wet etching or other suitable methods can also be utilized. In the embodiment pictured in FIG. 3, the layers 12, 14, and 16 of amorphous silicon may be removed, for example, using plasma etching by an etchant including chlorine and/or bromine containing gases, with or without diluent neutral gases. The silicon oxide layers 20 and 22 can be etched using a fluorine containing gas, such as $CF_4$, $C_2F_6$, or $C_3F_8$, and possibly hydrogen containing gas, such as $CHF_3$, to aid etching selectivity.

The levels of absorption of different regions of photomask 110 can be precisely controlled by controlling the removal of layers along those regions. In the depicted embodiment, with three layers 12, 14, and 16 of amorphous silicon, photomask 110 can provide at least four different levels of exposure. All layers are removed along those regions where maximum exposure is desired (e.g., region D). Conversely, regions where the least exposure (and maximum photomask light-absorption) is desired would be those where all three layers 12, 14, and 16 are left intact (e.g., region A). Intermediate exposure levels can be accomplished by removing one layer 16 (e.g., region B) or two layers 14 and 16 (e.g., region C) of the amorphous silicon, along with none, one, or two of the intervening silicon oxide layers 20 and 22. Each layer of light-absorbing material 12, 14, and 16 and an associated etch-stop layer 20 and 22 can be selectively removed if desired in accordance with conventional resist and etching operations, each as might be implemented in forming a single level mask.

An important aspect of the selected embodiments described herein is the ability to etch the light-absorbing (amorphous silicon) layers 12, 14, and 16 in a manner which essentially stops upon reaching the intervening etch-stop (silicon oxide) layers 20 and 22. Likewise, the etch-stop layers 20 and 22 can be etched without undue attack on the underlying light-absorbing layers 12, 14, and 16.

The photomask 110 of FIGS. 1–3 relies exclusively upon selective etching of multiple layers of uniform thickness to provide exposure and absorption regulation. An alternative implementation, however, is to control exposure through control of the thickness and the material composition of one or more of the individual layers.

Figure 4:
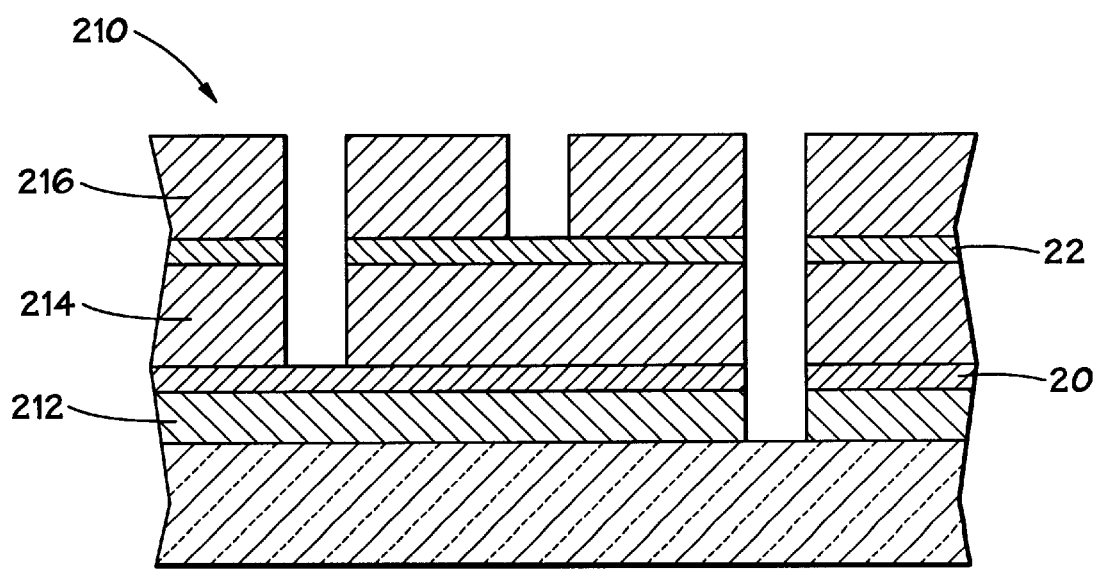
FIG. 4 depicts an alternative embodiment of a photomask manufactured in accordance with the present invention, again illustrated in vertical section.

FIG. 4 illustrates an alternate embodiment of a photomask 210 having layers of different thicknesses and varying materials. Photomask 210 includes a layer 216 of a first light-absorbing material and layers 214 and 212 of a second light-absorbing material. Layer 212 is only half the thickness of layer 214, thus providing a different incremental level of absorption. By varying the thickness of the light-absorbing layers, the absorption, and hence the exposure, can be accurately provided for any relative values. With more layers and different thicknesses almost any practical distribution of optical absorption can be achieved. The required thickness of the different layers can be readily calculated by use of well known optical formulae. For example, for a photomask having features as small as 0.25nm and for exposure using 365nm wavelength radiation, a typical deposition thickness for the light-absorbing layers 212, 214, and 216 will range between 100–800A, depending on the absorption characteristics of the layer. At a thickness of 100–800A, the light-absorption characteristics of an amorphous silicon layer range from $I/I_0=0.5$ to $I/I_0=0.004$. For this example, typical silicon oxide layers 20 and 22 will range from 100–500A, and offer a negligible light-absorbing range.

The present embodiment offers a photomask that contains regions which have varying levels of absorption and that, therefore, can produce an image that has received varying degrees of controlled exposure in different regions with a single exposure. Furthermore, by varying the number and the thickness of the layers 212, 214, and 216, the number of different levels of exposure that can be achieved simultaneously is practically limitless.

Figure 5:
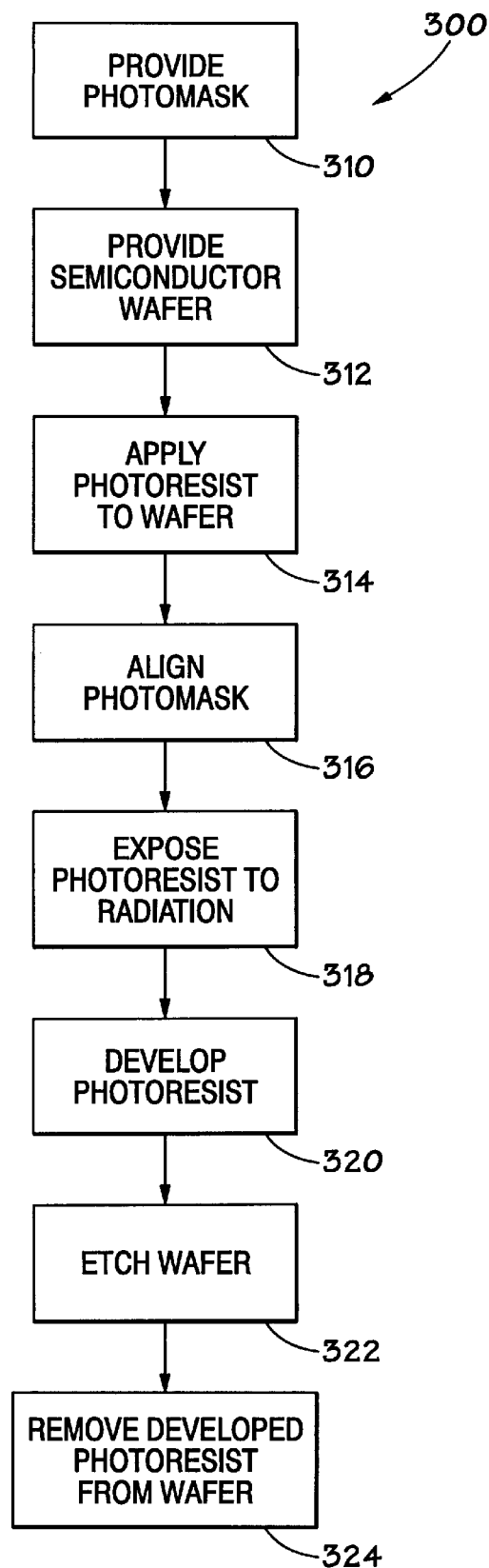
FIG. 5 is a schematic representation of the photomasking process for the manufacture of a semiconductor device.

Once the photomask 210 has been patterned and inspected, the imprinted pattern can be aligned or registered on a wafer of a semiconductor device. FIG. 5 shows a flow diagram 300 showing the use of a photomask in the fabrication of a semiconductor device. Step 310 includes first providing a photomask, such as photomask 210, manufactured in accordance with the present invention. A semiconductor wafer under fabrication is then provided in step 312.

A thin layer of a selected photoresist is applied in step 314 to the portion of the wafer wherein the photomask pattern is to be registered. Prior to this step, the wafer may be cleaned to remove contaminants and primed, such as with hexamethyldisilazane (HMDS), to increase photoresist adhesion. The photoresist is a light-sensitive material that changes its properties when exposed to light. Exemplary photoresists may include positively acting etch-resistant organic polymers that photosolubilize in the presence of the selected form of light, such as an M-Cresolformaldehyde polymer. The photoresist may be selected to respond to a specific wavelength of light, differing exposing surfaces, resolution, polymerization or photosolubilization characteristics (negative or positive type photoresist), exposure speed, adhesion, or any specific needs of the specific application. In an exemplary method, the photoresist is applied to the surface to be processed in a liquid state by a photoresist spinning process. The photoresist is spread over the surface and dries to a thin film.

The photomask is precisely aligned over the surface to be treated in step 316. During step 318, the photomask and the underlying resist through the photomask are exposed to the selected form of light, such as ultra-violet light in the present embodiment. The photomask pattern is transferred to the photoresist coating on the wafer surface by optical printing. Upon exposure to the selected light-source, the different light-absorbing layers of the photomask allow different levels of exposure and, accordingly, different levels of polymerization or photosolubilization of the photoresist. The time, intensity, and form of radiation selected for exposure can be calibrated taking into account the desired pattern and the selected photoresist and photomask materials.

Upon completion of the exposure step in step 320, the photoresist is developed, such as by applying a solvent (developer) that does not affect the underlying wafer, but which dissolves the unpolymerized portions of the photoresist. The semiconductor wafer can then be etched, in step 322, using the remaining portions of the photoresist as an etch-resist mask. In step 324, the remaining photoresist is removed by processes known in the art, such as by an acetone soak.

While the invention may be susceptible to various modifications and alternative forms, specific embodiments have been shown by way of example in the drawings and will be described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. A semiconductor manufacture mask comprising:
   a plurality of radiation-absorbing layers comprising a first layer of a first radiation-absorbing material and a second layer of a second radiation-absorbing material, the first radiation-absorbing material being different than the first radiation-absorbing material; and
   at least one etch-stop layer, said etch stop layer disposed between said first and second layers, wherein the plurality of radiation-absorbing layers and the at least one etch-stop layer are patterned to define a plurality of radiation-absorbing regions having different radiation absorption levels, wherein a first radiation-absorbing region comprises more than one of the plurality of radiation-absorbing layers and the at least one etch-stop layer, and wherein a second radiation-absorbing region comprises a lesser number of the plurality of radiation-absorbing layers.

2. The mask of claim 1, wherein one of said radiation-absorbing layers has a different thickness than another of said radiation-absorbing layers.

3. A semiconductor manufacture mask having multiple light-absorption levels, comprising:
   a plurality of light-absorbing layers, at least one of the light-absorbing layers comprising amorphous silicon; and
   at least one etch-stop layer, said etch-stop layer disposed between said light-absorbing layers, said etch-stop layer comprising silicon dioxide, wherein the plurality of light-absorbing layers and the at least one etch-stop layer are patterned to define a plurality of light-absorbing regions having different light absorption levels, wherein a first light-absorbing region comprises more than one of the plurality of light-absorbing layers and the at least one etch-stop layer, and wherein a second light-absorbing region comprises a lesser number of the plurality of light-absorbing layers.

4. The mask of claim 3, further comprising an underlying substrate.

5. The mask of claim 4, wherein said substrate comprises a quartz photomask substrate.

6. A method for manufacturing a photomask having multiple light-absorbing levels, the method comprising the steps of:
   providing a photomask substrate; and
   forming a plurality of layers of a light-absorbing material and a plurality of layers of an etch-stop material in an alternating fashion on said photomask substrate, the light-absorbing material and the etch-stop material being selectively etchable in relation to each other,
   wherein the plurality of layers of light-absorbing material comprise a first, second, and a third layers of light-absorbing material, the first and third layers of light-absorbing material comprising a first material, and the second layer of light-absorbing material comprising a second material different than the first material.

7. The method of claim 6, further comprising the step of removing at least a portion of at least one of said layers using an etching process.

8. The method of claim 7, wherein said step of removing comprises the step of selectively etching a portion of one of said layers of light-absorbing material using one of said layers of etch-stop material as an etching barrier.

9. The method of claim 7, wherein said step of removing comprises the step of selectively etching a portion of one of said layers of etch-stop material using one of said layers of light-absorbing material as an etching barrier.

10. The method of claim 6, wherein said etch-stop material comprises silicon dioxide.

11. The method of claim 6, wherein said first and third layers of light-absorbing material comprise amorphous silicon.

12. The method of claim 6, wherein one of said layers of light-absorbing material has a different thickness than another of said layers of light-absorbing material.

13. A method for manufacturing a photomask having multiple light-absorbing levels, the method comprising the steps of:
   providing a photomask substrate;
   depositing a first layer of a generally light-absorbing material onto said substrate, said first layer comprising chromium;
   forming a second layer of a buffer material onto said first layer, said second layer of a buffer material selectively etchable relative to said first layer, said second layer comprising silicon dioxide; and
   depositing a third layer of a generally light-absorbing material, said third layer of a material selectively etchable relative to said second layer.

14. The method of claim 13, further comprising the step of removing at least a portion of at least one of said layers using an etching process.

15. The method of claim 14, wherein said step of removing comprises the step of selectively etching a portion of said third layers of light-absorbing material using said second layer of buffer material as an etching barrier.

16. The method of claim 14, wherein said step of removing comprises the step of selectively etching a portion of said second layer of buffer material using said first layer of light-absorbing material as an etching barrier and at least partly using said third layer as an etching mask.

17. The method of claim 13, wherein said third layer comprises one of amorphous silicon, chromium, titanium, titanium nitride, tungsten, and molybdenum.

18. The method of claim 13, wherein one of said layers of light-absorbing material has a different thickness than other of said layers of light-absorbing material.

19. A method of manufacturing a photomask, comprising the acts of:
   (a) providing a substrate;
   (b) disposing a first layer of light-absorbing material on the substrate, the first layer of light-absorbing material having a first thickness;
   (c) disposing a first layer of etch-stop material on the first layer of light-absorbing material;

(d) disposing a second layer of light-absorbing material on the first layer of etch-stop material, the second layer of light-absorbing material having a second thickness different than the first thickness;

(e) disposing a second layer of etch-stop material on the second layer of light-absorbing material; and (f) disposing a third layer of light-absorbing material on the second layer of etch-stop material.

20. The method, as set forth in claim 19, comprising the act of:

forming a pattern window through at least the third layer of light-absorbing material and the second layer of etch-stop material.

21. The method, as set forth in claim 20, comprising the act of:

forming a pattern window through at least the second layer of light-absorbing material and the first layer of etch-stop material.

22. The method, as set forth in claim 21, comprising the act of:

forming a pattern window through the first layer of light-absorbing material.

23. The method, as set forth in claim 19, wherein the first layer of light-absorbing material is thinner than the second layer of light-absorbing material.

24. The method, as set forth in claim 19, wherein the first, second, and third layers of light-absorbing material comprise a same material.

25. The method, as set forth in claim 24, wherein the same material comprises one of amorphous silicon, chromium, titanium, titanium nitride, tungsten, and molybdenum.

26. The method, as set forth in claim 19, wherein the first and third layers of light-absorbing material comprise a first material and wherein the second layer of light-absorbing material comprises a second material different than the first material.

27. The method, as set forth in claim 19, wherein the first and second layer of etch-stop material comprise a same material.

28. The method, as set forth in claim 27, wherein the same material comprises silicon dioxide.

29. A method of manufacturing a photomask, comprising the acts of:

(a) providing a substrate;

(b) disposing N layers of light-absorbing material over the substrate, where N is an integer greater than 2 and the light-absorbing material comprises amorphous silicon; and (c) disposing N−1 layers of etch-stop material over the substrate between the respective N layers of light-absorbing material, where the etch-stop material comprises silicon dioxide.

30. The method, as set forth in claim 29, comprising the act of:

forming a pattern window through at least one of the N layers of light-absorbing material and at least one of the N−1 layers of etch-stop material.

31. The method, as set forth in claim 30, comprising the act of:

forming a pattern window through at least two of the N layers of light-absorbing material and at least two of the N−1 layers of etch-stop material.

32. The method, as set forth in claim 31, comprising the act of:

forming a pattern window through all of the N layers of light-absorbing material and all of the N−1 layers of etch-stop material.

33. The method, as set forth in claim 29, wherein at least one of the N layers of light-absorbing material has a thickness different than the other of the N layers of light-absorbing material.

34. A photomask comprising:

a substrate;

a first layer of light-absorbing material disposed over the substrate, the first layer of light-absorbing material comprising amorphous silicon and having a first thickness;

a first layer of etch-stop material disposed over the first layer of light-absorbing material, the first layer of etch-stop material comprising silicon dioxide;

a second layer of light-absorbing material disposed over the first layer of etch-stop material, the second layer having a second thickness different than the first thickness;

a second layer of etch-stop material disposed over the second layer of light-absorbing material;

a third layer of light-absorbing material disposed over the second layer of etch-stop material;

a first pattern window formed through at least the third layer of light-absorbing material and the second layer of etch-stop material;

a second pattern window through at least the second layer of light-absorbing material and the first layer of etch-stop material; and a third pattern window through the first layer of light-absorbing material.

35. The photomask, as set forth in claim 34, wherein the first layer of light-absorbing material is thinner than the second layer of light-absorbing material and thinner than the third layer of light-absorbing material.

36. The photomask, as set forth in claim 34, wherein the second layer of light-absorbing material comprises amorphous silicon.

37. The photomask, as set forth in claim 34, wherein the second layer of light-absorbing material comprises one of amorphous silicon, chromium, titanium, titanium nitride, tungsten, and molybdenum.

38. The photomask, as set forth in claim 34, wherein the third layer of light-absorbing material comprises amorphous silicon and wherein the second layer of light-absorbing material comprises a second material different than amorphous silicon.

39. The photomask, as set forth in claim 34, wherein the second layer of etch-stop material comprises silicon dioxide.

40. A photomask, comprising:

a substrate;

N layers of light-absorbing material disposed over the substrate, where N is an integer greater than 2, at least one of the N layers of light-absorbing material comprising amorphous silicon;

N−1 layers of etch-stop material disposed over the substrate between the respective N layers of light-absorbing material, at least one of the N−1 layers of etch-stop material comprising silicon dioxide;

a first pattern window formed through at least one of the N layers of light-absorbing material and at least one of the N−1 layers of etch-stop material;

a second pattern window formed through at least two of the N layers of light-absorbing material and at least two of the N−1 layers of etch-stop material; and a third pattern window through all of the N layers of light-absorbing material and all of the N−1 layers of etch-stop material.

41. The photomask, as set forth in claim 40, wherein at least one of the N layers of light-absorbing material has a thickness different than the other of the N layers of light-absorbing material.

42. The photomask, as set forth in claim 40, wherein the other of the N layers of light-absorbing material comprise a same material.

43. The photomask, as set forth in claim 42, wherein the same material comprises one of amorphous silicon, chromium, titanium, titanium nitride, tungsten, and molybdenum.

44. The photomask, as set forth in claim 40, wherein the other of the N−1 layers of etch-stop material comprise a same material.

45. The photomask, as set forth in claim 44, wherein the same material comprises silicon dioxide.

* * * * *